United States Patent
Jeong

(10) Patent No.: US 8,093,631 B2
(45) Date of Patent: Jan. 10, 2012

(54) NON-VOLATILE MEMORY DEVICE AND METHOD FOR FABRICATING THE SAME

(75) Inventor: Yong-Sik Jeong, Chungcheongbuk-do (KR)

(73) Assignee: Magnachip Semiconductor, Ltd., Cheongju-Si (KR)

( * ) Notice: Subject to any disclaimer, the term of this patent is extended or adjusted under 35 U.S.C. 154(b) by 533 days.

(21) Appl. No.: 12/228,211

(22) Filed: Aug. 11, 2008

(65) Prior Publication Data

US 2008/0296654 A1 Dec. 4, 2008

Related U.S. Application Data

(62) Division of application No. 11/250,052, filed on Oct. 12, 2005, now Pat. No. 7,425,482.

(60) Provisional application No. 60/618,635, filed on Oct. 13, 2004.

(51) Int. Cl.
*H01L 27/148* (2006.01)
*H01L 29/80* (2006.01)
*H01L 27/108* (2006.01)

(52) U.S. Cl. ........ 257/239; 257/261; 257/298; 257/314; 257/317; 257/320; 257/E21.662; 257/E21.663; 257/E21.687; 257/E21.688

(58) Field of Classification Search ........... 257/E21.209, 257/E21.662, E21.663, E21.687, E21.688
See application file for complete search history.

(56) References Cited

U.S. PATENT DOCUMENTS

| | | | | | |
|---|---|---|---|---|---|
| 5,414,286 | A | * | 5/1995 | Yamauchi | 257/315 |
| 5,981,364 | A | * | 11/1999 | Ramsbey et al. | 438/592 |
| 6,451,652 | B1 | * | 9/2002 | Caywood et al. | 438/257 |
| 6,452,226 | B2 | * | 9/2002 | Kawai et al. | 257/315 |
| 6,686,632 | B2 | * | 2/2004 | Ogura et al. | 257/374 |
| 6,979,617 | B2 | * | 12/2005 | Lee | 438/257 |
| 7,183,662 | B2 | * | 2/2007 | Kim et al. | 257/314 |
| 2003/0198086 | A1 | * | 10/2003 | Shukuri | 365/185.18 |
| 2004/0026748 | A1 | * | 2/2004 | Goda et al. | 257/390 |
| 2004/0151028 | A1 | * | 8/2004 | Chih et al. | 365/185.23 |
| 2004/0191993 | A1 | * | 9/2004 | Kobayashi | 438/266 |
| 2005/0117419 | A1 | * | 6/2005 | Hoshino et al. | 365/202 |

* cited by examiner

*Primary Examiner* — Mohsen Ahmadi
(74) *Attorney, Agent, or Firm* — NSIP Law

(57) ABSTRACT

A non-volatile memory device and a method for fabricating the same are provided. The method includes: forming a gate structure on a substrate, the gate structure including a first insulation layer, a first electrode layer for a floating gate and a second insulation layer; forming a third insulation layer on the gate structure covering predetermined regions of the substrate adjacent to the gate structure; and forming a second electrode layer for a control gate on the third insulation layer disposed on sidewalls of the gate structure and the predetermined regions of the substrate.

24 Claims, 10 Drawing Sheets

NON-VOLATILE MEMORY DEVICE AND METHOD FOR FABRICATING THE SAME

This application is a division of application Ser. No. 11/250,052 filed on Oct. 12, 2005, now U.S. Pat. No. 7,425,482, which claims the benefit of Provisional Application No. 60/618,635 filed on Oct. 13, 2004, now expired, the entire disclosures of which are incorporated herein by reference for all purposes.

FIELD OF THE INVENTION

The present invention relates to a non-volatile memory device and a method for fabricating the same; and, more particularly, to a non-volatile memory device and a method for fabricating the same, wherein spacers for use in control gates can be easily formed through an etch-back process and a shadow event does not occur during an ion implantation process.

DESCRIPTION OF RELATED ARTS

Generally, non-volatile memory devices, especially, flash memory devices are classified into two cell types. One cell type is an electrically tunneling oxide (ETOX) and the other cell type is a split gate. The ETOX type is advantageous in respect of a cell size. The cell size of the ETOX type is smaller than that of the split gate type. However, during a programming operation, the ETOX type consumes lots of current because of an implantation of high thermal carriers and programming and reading errors occur frequently. Also, the ETOX type has a frequent occurrence of an over-erase event, which is crucially related to reliability.

Despite that the cell size of the split gate type is big, the split gate type is more widely used in semiconductor industries since the split gate type has excellent reliability. There is not a concern about the over-erase event when using the split gate type flash memories. Since a select transistor exists within a unit cell, a consistent level of a threshold voltage can be maintained. Hence, even if the cell transistor is depleted, an external device can sense the threshold voltage of the select transistor.

Various technologies have been developed and implemented to fabricate such advantageous split gate type flash memories. However, in those developed and currently implemented technologies of fabricating split gate type flash memories, a channel length of the select transistor is determined by a photolithography process. Thus, the channel length of the select transistor is dependent on the fact that how the photolithography equipment can precisely perform an alignment technology. Because of this dependency, the channel length of the select transistor often becomes inconsistent.

In an attempt to resolve the above disadvantage, a self-alignment method is employed to form select transistors. U.S. Pat. No. 6,451,652 issued to John Caywood et al., entitled "Method for Forming an EEPROM Cell Together With Transistor for Peripheral Circuit" introduces a fabrication method of a split gate flash memory device based on the self-alignment method.

FIG. 1 is a top view illustrating a layout of a unit cell of a conventional electrically erasable programmable read-only memory (EEPROM).

AS illustrated, the unit cell of the conventional EEPROM includes a floating gate 222, which is electrically connected. The floating gate 222 is formed underneath a polysilicon layer 120 for a control gate.

FIGS. 2A to 2D are cross-sectional views of the conventional EEPROM of FIG. 1 for illustrating a method for fabricating the same. Particularly, the illustrated conventional EEPROM is cut in the direction of a line A-A' of FIG. 1. The same reference numerals used in FIG. 1 are used for the same elements described in the following drawings.

Referring to FIG. 2A, first insulation layers 206 and 208 are formed in a substrate 224. The first insulation layers 206 and 208 are device isolation layers obtained through a shallow trench isolation method. As the name indicates, the first insulation layers 206 and 208 isolate memory cells electrically. A silicon oxide layer 230 is formed thinly on a certain region of the substrate 224. A floating gate 222 is formed on the silicon oxide layer 230.

Referring to FIG. 2B, a photo-exposure process and a subsequent etching process are performed to complete the formation of the floating gate 222 and then, a third insulation layer including an upper insulation layer 232 and lower insulation layers 236 and 234 is formed over the floating gate 222. Gate oxide layers 202 and 204 are formed in a peripheral region. A conductive layer 240 is formed over the above resulting structure. The conductive layer 240 is based on a material to be used as an electrode. Metals and semiconductor materials are examples of such electrode material.

The silicon oxide layer 230 is a gate dielectric layer for the floating gate 222, and the upper insulation layer 232 and the lower insulation layers 234 and 236 are gate dielectric layers for a select transistor. The gate oxide layers 202 and 204 are gate dielectric layers for those transistors formed in the peripheral region.

Referring to FIG. 2C, a photoresist layer is formed over the conductive layer 240 and photo-exposed to form a first photoresist pattern 250 and a second photoresist pattern 252. The first photoresist pattern 250 is disposed such that each lateral edge of the first photoresist pattern 250 is placed between one outer edge of the upper insulation layer 232, which encompasses the floating gate 222, and one sidewall edge of the conductive layer 240. As simultaneous to the formation of the first photoresist pattern 250, the second photoresist pattern 252 for forming gates is formed in the peripheral region except for a cell region where memory array exists.

Referring to FIG. 2D, the conductive layer 240 is etched using the first photoresist pattern 250 and the second photoresist pattern 252 as an etch mask. The conductive layer 240 is etched in an amount that is higher than the addition of the thickness of the conductive layer 240 and a delta amount taking account of process parameter variations. After the etching process, in the cell region, spacers 260 and 262 are formed larger than the first photoresist pattern 250. The spacers 260 and 262 have the same size regardless of a change in the photo-exposure/etching process.

Another suggested method for forming a select transistor according to the self-alignment method is taught in U.S. Pat. No. 6,365,449 issued to Max C. Kuo et al., entitled "Process for Making Non-volatile Memory Cell with a Polysilicon Spacer Defined Select Gate." Particularly, this suggested method introduces fabrication of a split gate type flash memory device with a select transistor.

FIGS. 3A and 3B are cross-sectional views of another conventional split gate type flash memory device with a self-aligned select transistor for illustrating a fabrication method thereof.

Referring to FIG. 3A, a tunnel oxide layer 12 is formed on a substrate 22. The tunnel oxide layer 12 has a thickness of 85 Å although the typically formed thickness is in a range of 70 Å to 100 Å. Although not illustrated, a first polysilicon layer is formed thereon and is patterned using a photoresist layer, and as a result, a floating gate 14 is obtained. The floating gate 14 has a thickness t3 ranging from 1,000 Å to 3,000 Å. An inter-poly-dielectric (IPD) layer 16 is formed over the floating gate 14 and the substrate 22. The IPD layer 16 typically includes an oxide layer, a nitride layer and a combination thereof. A second polysilicon layer 18 is formed on the IPD layer 16. The second polysilicon layer 18 has a thickness ranging from 1,500 Å to 4,000 Å. A preferable thickness of the second polysilicon layer 18 is 2,500 Å. Reference denotations t1 and t2 represent thicknesses of certain portions of the second polysilicon layer 18. A photoresist layer is formed over the second polysilicon layer 18 and photo-exposed to form a photoresist pattern 20. The edges of the photoresist pattern 20 are disposed in the inward directions X and Y from the sidewalls of the second polysilicon layer 18.

Referring to FIG. 3B, the second polysilicon layer 18 is etched using the photoresist pattern 20 as an etch mask. An etching amount of the second polysilicon layer 18 is determined based on the addition of the thickness of the second polysilicon layer 18 and an over-etching amount caused by a process margin. Through this etching process, a control gate is formed in a manner to encompass the floating gate 14 and the IPD layer 16.

Sidewalls of the control gate act as a gate of a select transistor. A plurality of the select transistors are formed with the identical size, and in addition to the illustrated region in FIG. 3B, the select transistors are formed in the identical sizes in other regions as well.

However, the above described conventional flash memory devices have disadvantages. With reference to FIG. 4, detailed description of the disadvantages will be provided hereinafter.

As illustrated in FIG. 4, when a conductive layer 462 is etched, a poly-slope or a poly-peak is formed due to polymers, which are generated by photoresist patterns 450 and an etchant used in the etching process. The above poly-slope or poly-peak generation may become a cause of inducing a salicide-stimulated electric short between a control gate (i.e., the patterned portions of the conductive layer 462) and a silicon substrate 424 during a subsequent salicide process. Thus, salicide is not formed intentionally in the cell region. However, there may be other disadvantages of increasing resistance caused by a decrease in the contact hole size and increasing resistance of the control gate. Also, the poly-peak may act as a foreign material, which may further induce product defects.

When gates of flash memory devices are formed in a stack type, heights of cells are also increased. Thus, it is difficult to perform an ion implantation process with an intended angle to form cell junction regions. Also, as depths of bit line contacts and other contacts in the peripheral region get deeper, it is much difficult to implement relevant fabrication processes, thereby diminishing device yields.

When the control gate is doped, a shadow effect appears during the ion implantation process due to the photoresist pattern. Thus, it may be difficult to dope the gates of the select transistors.

Although the gates of the select transistors can be formed by the self-alignment method as illustrated in FIGS. 3A and 3B, the gate sizes of the select transistors may vary when a misalignment event occurs or a critical dimension is changed due to variations in process parameters or equipment conditions. The gate size variation gets severe as the thickness of the second polysilicon layer 18 is decreased. In consideration of a current trend that the second polysilicon layer 18 gets thinner as semiconductor devices are micronized, it may be difficult to fabricate micronized and integrated devices based on the aforementioned conventional methods.

SUMMARY OF THE INVENTION

It is, therefore, an object of the present invention to provide a method for fabricating a non-volatile memory device, wherein spacers of a control gate can be easily formed through an etch-back process instead of a photo-exposure/etching process and a shadow effect does not occur during an ion implantation process for doping the control gate.

It is another object of the present invention to provide a method for fabricating a non-volatile memory device, wherein a salicide formation can be implemented over the entire chip region, so that the chip area can be reduced by a decrease in word line resistance and contact resistance and thus, cost competitive and stabilized device yields can be achieved.

It is still another object of the present invention to provide a method for fabricating a non-volatile memory device, which can be self-aligned even if devices are micronized and thicknesses of gate electrodes are decreased.

It is a further object of the present invention to provide a method for fabricating a non-volatile memory device, wherein a height of a cell is decreased as a control gate does not exist on a floating gate and thus, a contact hole can be formed more easily, thereby improving device yields.

It is an even further object of the present invention to provide a method for fabricating a non-volatile memory device, wherein a height of a floating gate can be freely adjustable to increase the coupling ratio.

In accordance with an aspect of the present invention, there is provided a method for fabricating a non-volatile memory device, including: forming a gate structure on a substrate, the gate structure including a first insulation layer, a first electrode layer for a floating gate and a second insulation layer; forming a third insulation layer on the gate structure covering predetermined regions of the substrate adjacent to the gate structure; and forming a second electrode layer for a control gate on the third insulation layer disposed on sidewalls of the gate structure and the predetermined regions of the substrate.

In accordance with another aspect of the present invention, there is provided a method for fabricating a non-volatile memory device, including: forming a gate structure for storing data on a first region of a substrate, wherein the gate structure including a first insulation layer, a first electrode layer for a floating gate and a second insulation layer; forming a third insulation layer on the gate structure covering predetermined portions of the first region adjacent to the gate structure; forming a fourth insulation layer on a second region of the substrate; forming a second electrode layer covering the third insulation layer and the fourth insulation layer; forming a photoresist pattern on the fourth insulation layer; and patterning the second electrode layer using the photoresist pattern as an etch mask to form a gate electrode pattern for a peripheral circuit underneath the photoresist pattern and to form an electrode pattern for a control gate on sidewalls of the gate structure.

In accordance with still another aspect of the present invention, there is provided a non-volatile memory device, including: a plurality of gate structures arranged with a predetermined distance, each gate structure including a first insulation layer, a first electrode layer for a floating gate and a second insulation layer; a plurality of second electrode layers for control gates formed to encompass sidewalls of the individual gate structures; and a plurality of third insulation layers encompassing the respective gate structures such that the individual second electrode layers are apart from the individual gate structures with a predetermined distance.

In accordance with further aspect of the present invention, there is provided a non-volatile memory device, including: a first gate structure for storing data, the first gate structure including a first insulation layer, a first electrode layer for a floating gate and a second insulation layer; a third insulation layer formed on the first gate structure covering regions adjacent to a predetermined region contacting the first gate structure; and a second electrode layer for a control gate formed on sidewalls of the third insulation layer.

BRIEF DESCRIPTION OF THE DRAWINGS

The above and other objects and features of the present invention will become better understood with respect to the following description of example embodiments given in conjunction with the accompanying drawings, in which.

DETAILED DESCRIPTION OF THE INVENTION

A non-volatile memory device and a method for fabricating the same in accordance with specific embodiments of the present invention will be described in detail with reference to the accompanying drawings, which is set forth hereinafter.

Figure 5:
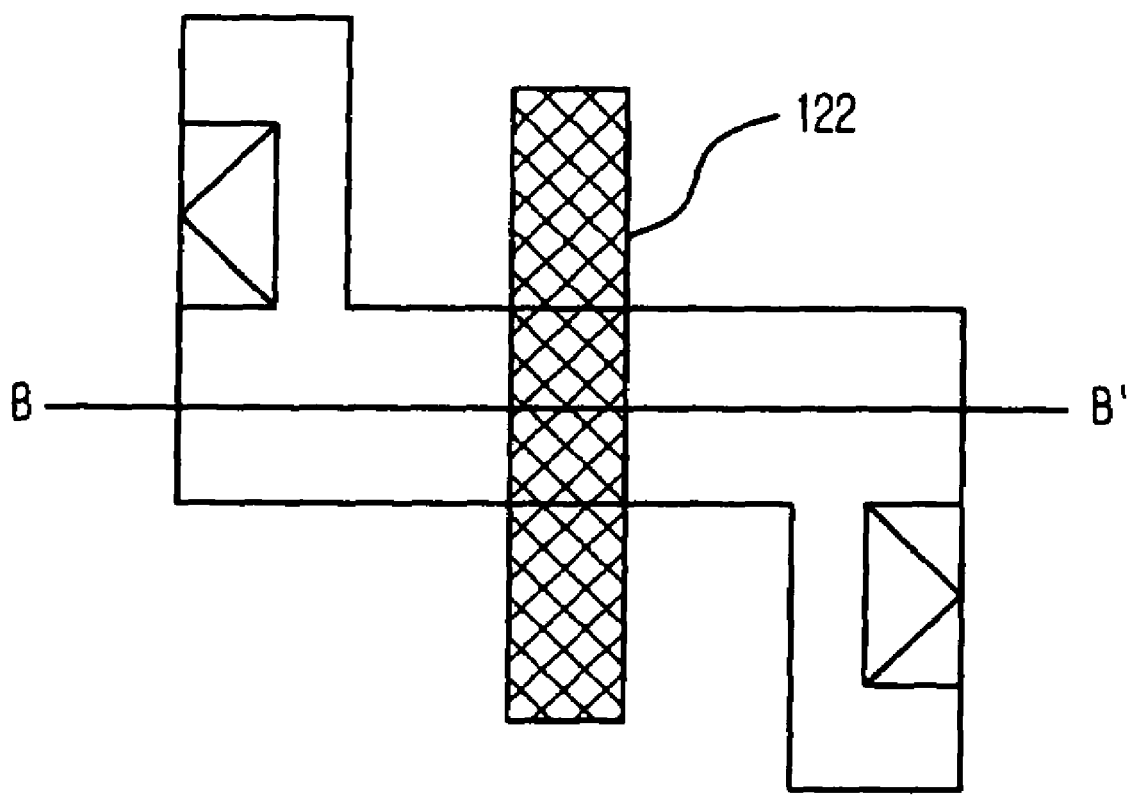
FIG. 5 is a top view showing a unit cell layout of a non-volatile memory device in accordance with an example embodiment of the present invention.

FIG. 5 is a top view illustrating a unit memory cell of a non-volatile memory device in accordance with a specific embodiment of the present invention.

Figure 1:
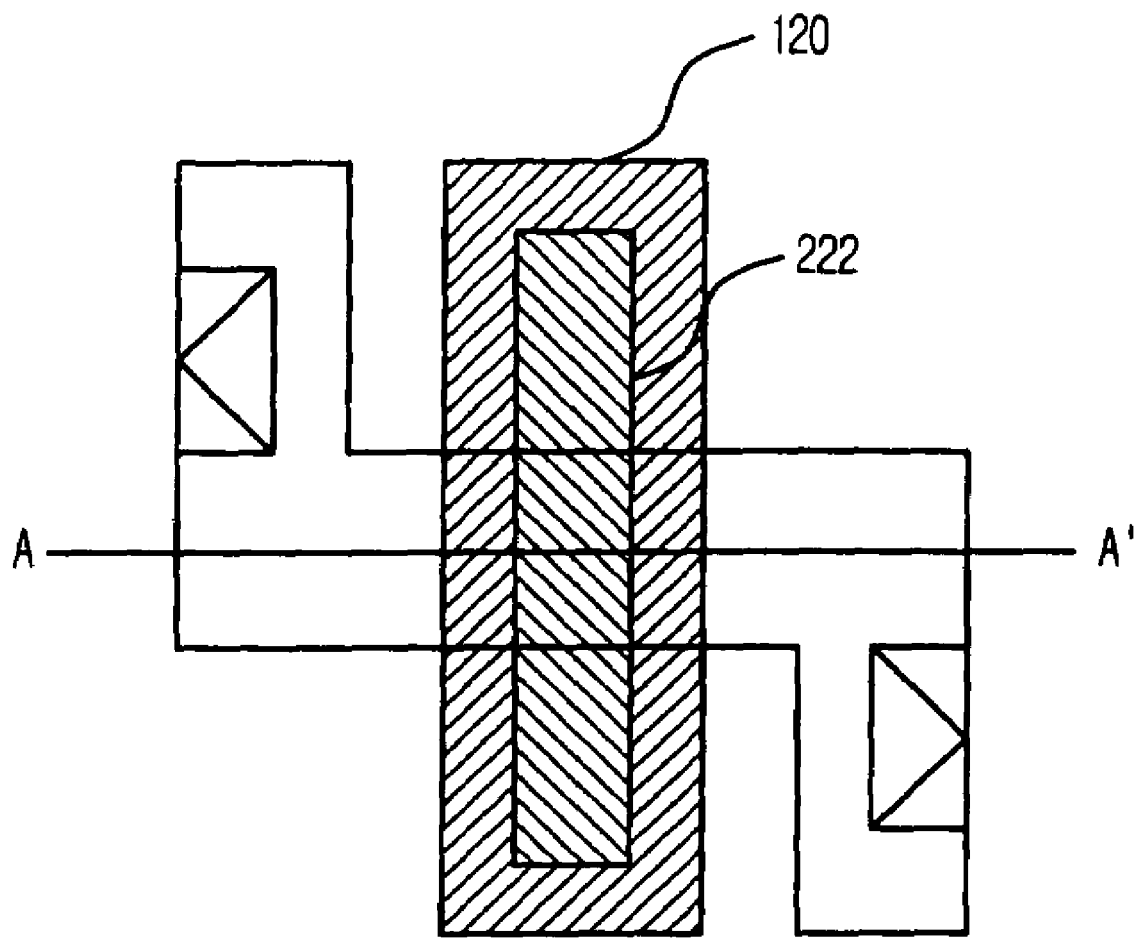
FIG. 1 is a top view showing a unit cell layout of a conventional electrically erasable programmable read-only memory (EEPROM)
Figure 2A:
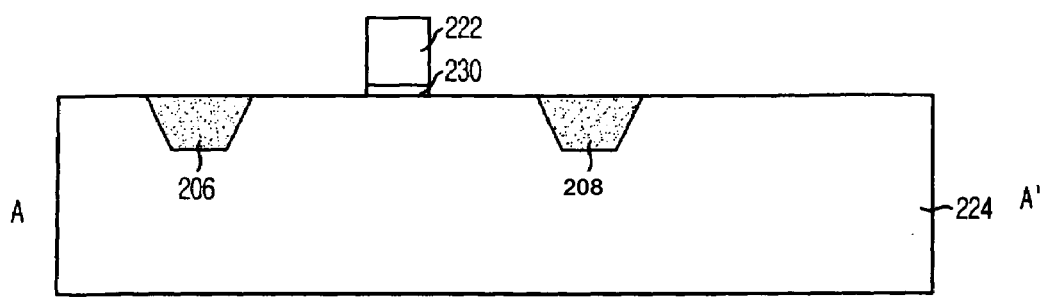
FIGS. 2A to 2D are cross-sectional views illustrating a method for fabricating the conventional EEPROM cut in the direction of a line A-A' shown in FIG. 1.
Figure 2B:
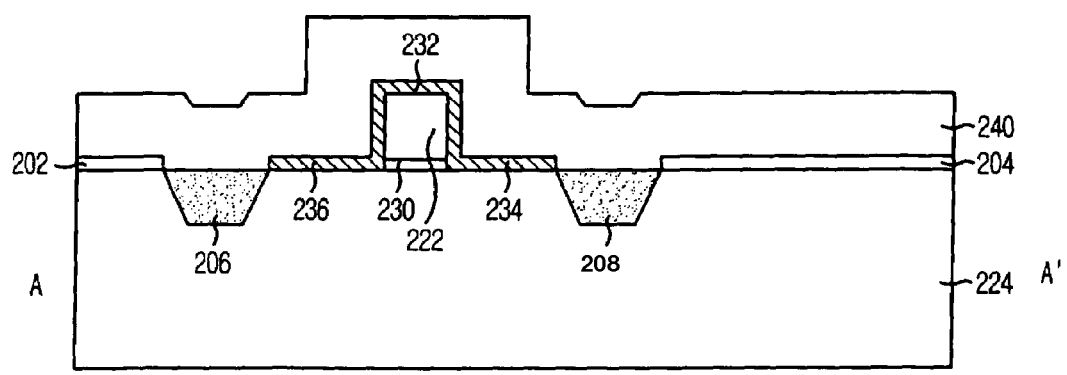
Figure 2C:
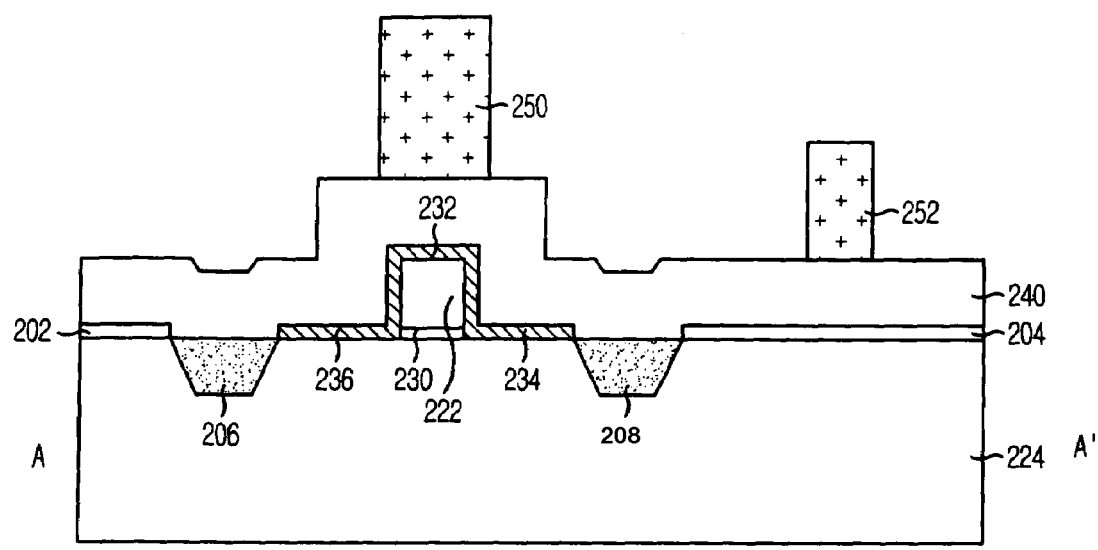
Figure 2D:
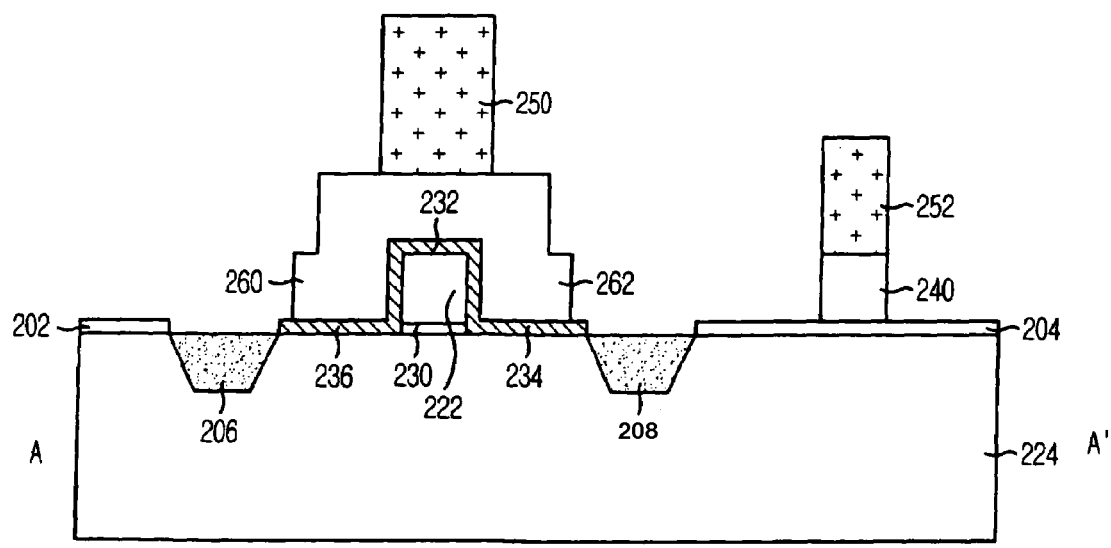
Figure 3A:
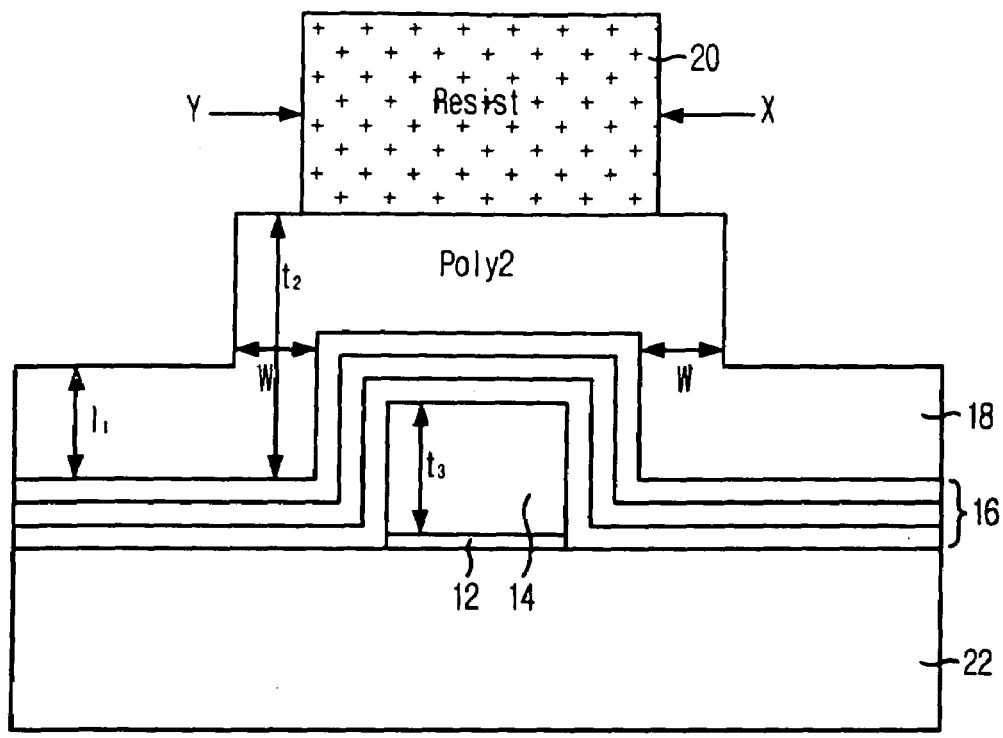
FIGS. 3A and 3B are cross-sectional views of a conventional split gate type flash memory device with a self-aligned select transistor.
Figure 3B:
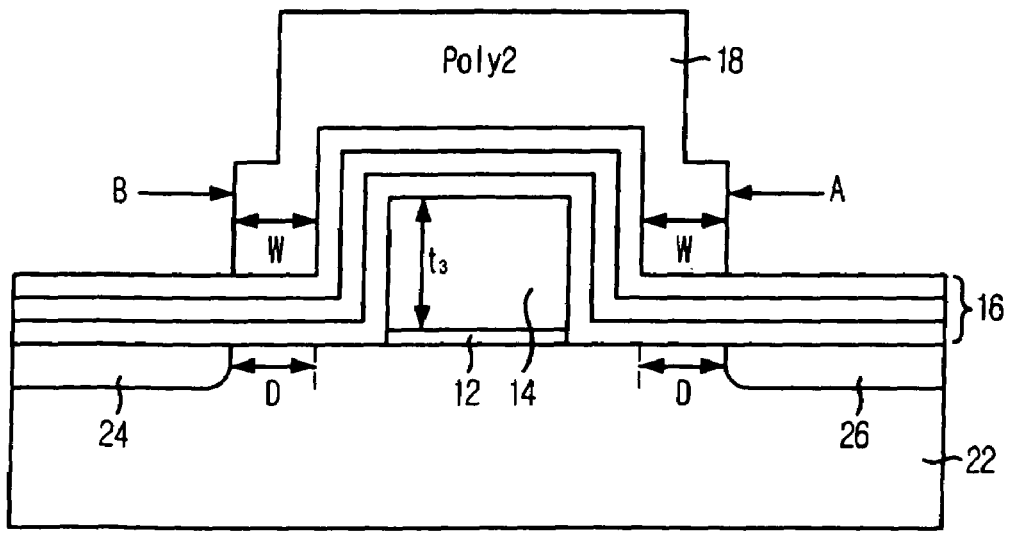
Figure 4:
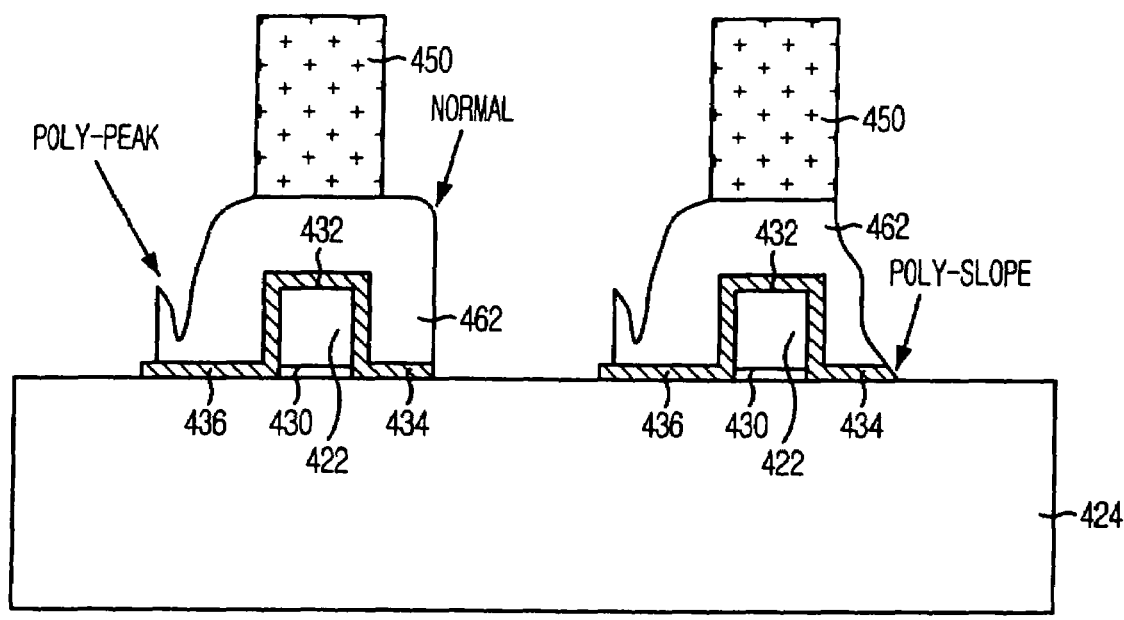
FIG. 4 is a diagram depicting disadvantages of using various types of conventional non-volatile memory devices.

Being different from the unit memory cell of the conventional memory cell layout illustrated in FIG. 1, the unit memory cell layout of the non-volatile memory device includes a floating gate 122 without including a polysilicon layer typically used to form a control gate over the floating gate 122.

FIGS. 6A to 6D are cross-sectional views of the non-volatile memory device cut in the direction of a line B-B' of FIG. 5 for illustrating a method for fabricating the same.

Figure 6A:
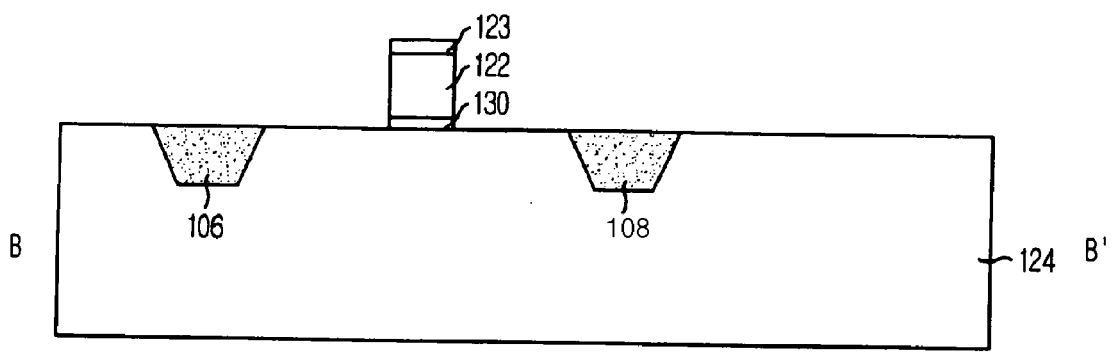
FIGS. 6A to 6D are cross-sectional views of the non-volatile memory device cut in the direction of a line B-B' of FIG. 5 for illustrating a method for fabricating the same.

Referring to FIG. 6A, trenches are formed in predetermined regions of a substrate 124 by employing a shallow trench isolation (STI) method and, first insulation layers 106 and 108 are filled into the trenches to isolate memory cells electrically.

A tunneling oxide layer 130 is formed thinly on the substrate 124, and a floating gate 122 is formed as an electrode on the tunneling oxide layer 130. The tunneling oxide layer 130 has a preferable thickness ranging from approximately 70 Å to approximately 100 Å. Afterwards, a second insulation layer 123 is formed on the floating gate 122. The second insulation layer 123 is used to form a hard mask.

According to the specific embodiment of the present invention, the floating gate 122 has a thickness ranging from approximately 1,000 Å to approximately 5,000 Å. This thickness of the floating gate 122 should be determined carefully since the thickness is an important factor for determining the coupling ratio of the floating gate 122.

Also, the second insulation layer 123 can be one selected from a group consisting of oxide, nitride and a combination thereof. A thickness of the second insulation layer 123 is determined by the thickness of the floating gate 122 and, the thickness of the second insulation layer 123 is in a range of approximately 500 Å to approximately 2,000 Å. The formation of the floating gate 122 is achieved via a photo-exposure process and an etching process.

Figure 6B:
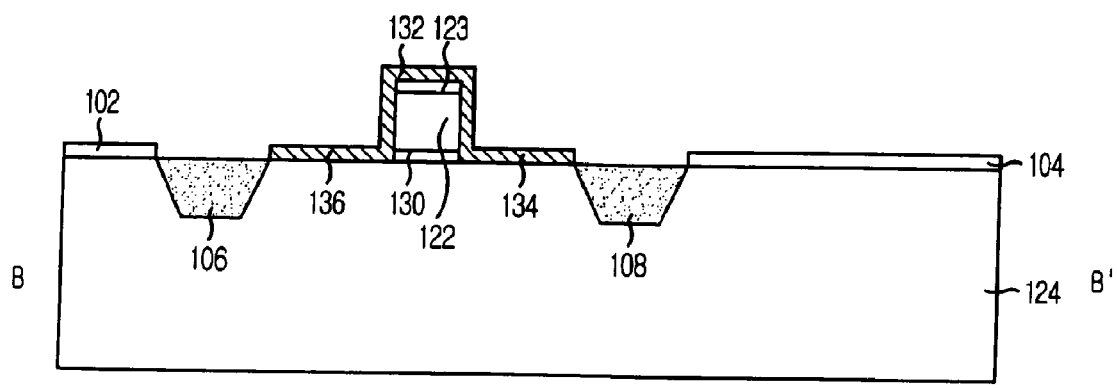

Referring to FIG. 6B, after the formation of the floating gate 122, a third insulation layer including an upper insulation layer 132 and lower insulation layers 134 and 136 are formed over the second insulation layer 123 encompassing sidewalls of the floating gate 122. As shown in FIG. 6B, the third insulation layer covers a gate structure, including the floating gate 122, and active regions located at each side of the gate structures. The upper insulation layer 132 and the lower insulation layers 134 and 136 can be formed of a material selected from a group consisting of oxide, nitride and a combination thereof. In a peripheral region, gate insulation layers 102 and 104 are formed on the substrate 124. The thicknesses of the gate insulation layers 102 and 104 are determined by usage of the circuits and devices. The gate insulation layers 102 and 104 may have the same or different thicknesses. In the case that the gate insulation layers 102 and 104 have a different thickness, a complex gate insulation process is implemented to form the gate insulation layers 102 and 104 with different thicknesses.

A conductive layer 140 is formed over the above resulting structure. The conductive layer 140 is an electrode material selected from a group consisting of polysilicon, amorphous silicon (Si), tungsten (W), tungsten silicide ($WSi_x$), and titanium (Ti).

Figure 6C:
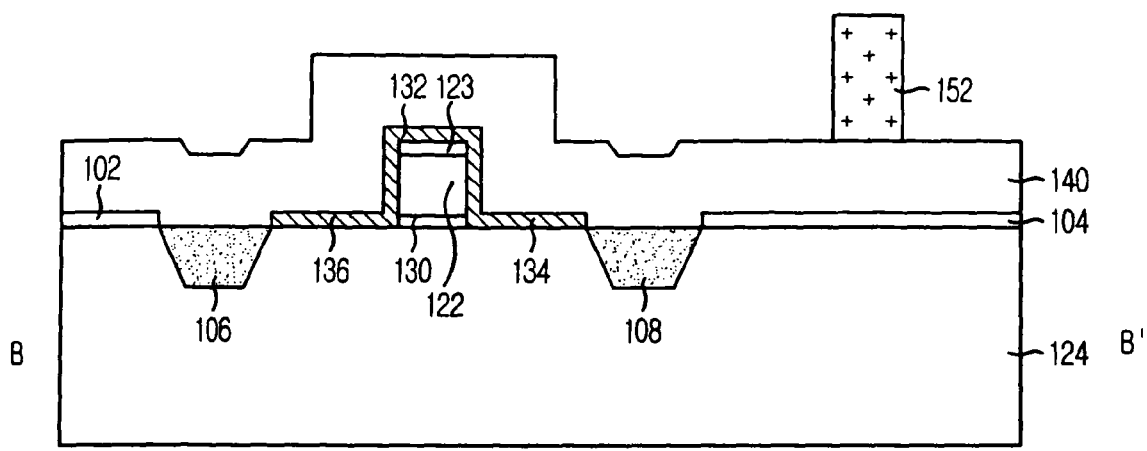

Referring to FIG. 6C, a photoresist layer is formed over the conductive layer 140 and photo-exposed to obtain a photoresist pattern 152. As illustrated in FIG. 6C, the photoresist pattern 152 is not formed in the cell region but in the peripheral region to form a gate for use in a peripheral circuit. One distinctive feature of the specific embodiment of the present invention is that a control gate can be formed in the cell region without using the photoresist pattern.

Figure 6D:
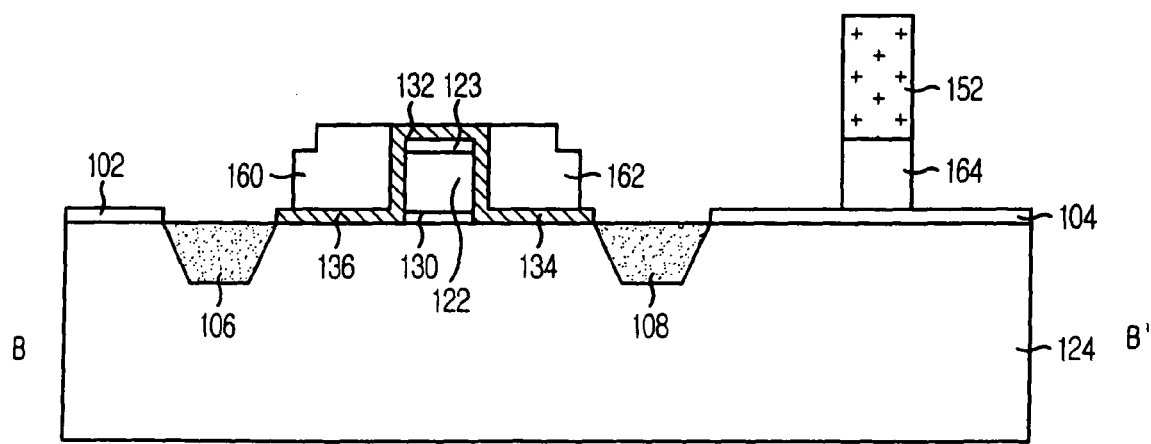

Referring to FIG. 6D, the conductive layer 140 is etched using the photoresist pattern 152 as an etch mask. The etching amount of the conductive layer 140 is determined based on the addition of the thickness of the conductive layer 140 and a delta amount taking account of potential variations in related processes.

After the above etching process, spacers 160 and 162 are formed on the active regions locates at each side of the gate structure in the cell region by performing an etch-back process to the conductive layer 140. The spacers 160 and 162 are used as the aforementioned control gate. Sizes of the spacers 160 and 162 are the same because of the etch-back process instead of the conventionally employed photo-exposure process and the etching process, which result in a poly- peak or poly-slope generation. A gate electrode 164 is simultaneously formed in the peripheral region.

Figure 7:
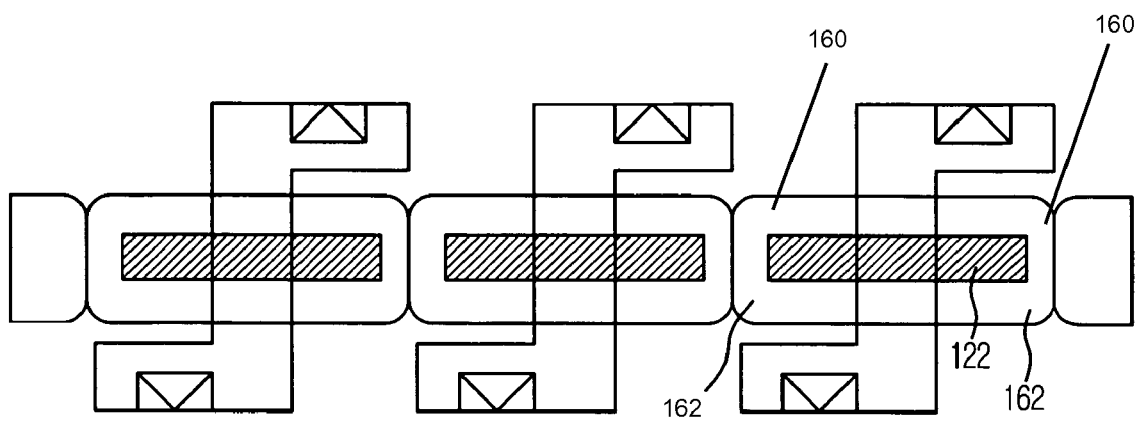
FIG. 7 is a top view showing a layout of a non-volatile memory device obtained after a gate etching process in accordance with an example embodiment of the present invention.

FIG. 7 is a top view showing a non-volatile memory device obtained after the above etching process for forming the control gate (i.e., the spacers 160 and 162) and the floating gate 122 in accordance with the specific embodiment of the present invention. Herein, the same reference numerals are used for the same elements described in FIGS. 6A to 6D.

As previously shown in FIGS. 6B to 6D, the floating gates 122 are isolated by the third insulation layers 132, 134, and 136. Also, as is additionally shown in FIG. 7, the control gates are formed in the form of sidewall spacers 160 and 162. The spacers 160 and 162 are not disconnected but connected as word lines through being appropriately arranged at a first terminal and a node connected with a bias circuit.

In accordance with the specific embodiment of the present invention, the control gate in the cell region is formed by the etch-back process instead of the conventional photo-exposure process and the etching process. Thus, spacers for use in the control gate can be easily formed and a shadow effect does not appear during an ion implantation process.

Figure 8:
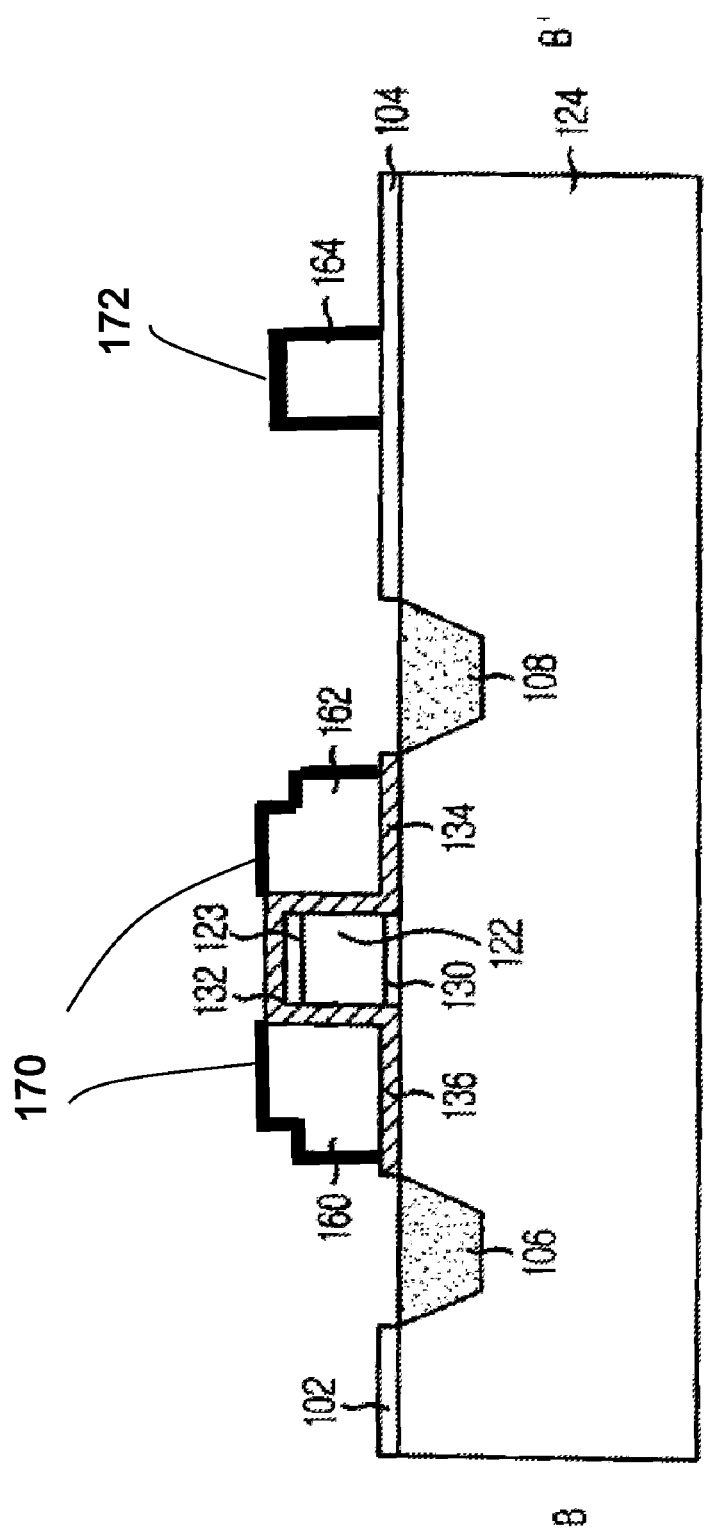
FIG. 8 is a cross-section view of the non-volatile memory device cut in the direction of a line B-B' of FIG. 5 where a chip area is covered with salicide.

Also, the implementation of the etch-back process gives a normal shape of the spacers (i.e., no poly-peak or poly-slope event). Thus, there is no occurrence of an over-bridge event caused by salicide. As a result of this effect, salicide can be applied over the entire chip area, as is shown by salicide layers 170 and 172 in FIG. 8, thereby reducing word line resistance and contact resistance. The decrease in the word line resistance and contact resistance contribute to a smaller chip area. Accordingly, more cost-competitive and stabilized device yields can be achieved.

Since the control gate does not exist over the floating gate, a height of a memory cell is decreased, thereby further decreasing a height of a contact hole. The decrease in the height of the contact hole can prevent various defect generations.

While the present invention has been described with respect to certain preferred embodiments, it will be apparent to those skilled in the art that various changes and modifications may be made without departing from the spirit and scope of the invention as defined in the following claims.

What is claimed is:

1. A non-volatile memory device, comprising:
   a plurality of gate structures formed on a substrate, each gate structure including an electrode layer for a floating gate;
   a gate structure insulation layer covering the gate structures and active regions located at each side of the gate structures;
   a plurality of control gates formed on the gate structure insulation layer located at each side of the floating gates by performing an etch-back process; and
   a salicide layer formed in a chip area including the plurality of control gates on the gate structure insulation layer located at each side of the floating gates.

2. The non-volatile memory device of claim 1, wherein each control gate is formed to encompass each side of the floating gates.

3. The non-volatile memory device of claim 2, wherein the floating gates and the control gates include a material selected from a group consisting of polysilicon, amorphous silicon, tungsten, tungsten silicide, and titanium.

4. The non-volatile memory device of claim 1, wherein the control gates are connected to each other.

5. The non-volatile memory device of claim 4, wherein each control gate is used to connect word lines in a unit of one byte or a predetermined number of bytes.

6. The non-volatile memory device of claim 1, wherein:
   each gate structure includes a tunneling oxide layer and a second insulation layer; and
   the floating gates are formed between the tunneling oxide layer and the second insulation layer.

7. The non-volatile memory device of claim 6, wherein the gate structure insulation layer and the second insulation layer include a material selected from a group consisting of oxide, nitride, and a combination thereof.

8. The non-volatile memory device of claim 6, wherein the tunneling oxide layer has a thickness ranging from approximately 70 Å to approximately 100 Å.

9. The non-volatile memory device of claim 6, wherein the second insulation layer has a thickness ranging from approximately 500 Å to approximately 2,000 Å.

10. The non-volatile memory device of claim 6, wherein the second insulation layer is formed between the floating gates and the gate structure insulation layer.

11. The non-volatile memory device of claim 1, wherein the floating gates have a thickness ranging from approximately 1,000 Å to approximately 5,000 Å.

12. The non-volatile memory device of claim 1, wherein the plurality of control gates is formed other than over the floating gates.

13. A non-volatile memory device, comprising:
   floating gate formed on a substrate;
   a plurality of control gates formed on the substrate and on opposing sides of the floating gate;
   a gate structure insulation layer covering the floating gate and separating each of the control gates from the floating gate and the substrate; and
   a salicide layer formed in a chip area, the chip area comprising the plurality of control gates.

14. The non-volatile memory device of claim 13, wherein the control gates surround the opposing sides of the floating gate.

15. The non-volatile memory device of claim 13, wherein the control gates are connected to each other to surround the opposing sides of the floating gate.

16. The non-volatile memory device of claim 13, wherein the salicide layer is formed over an entirety of the chip area.

17. The non-volatile memory device of claim 13, further comprising:
   a tunneling oxide layer disposed between the substrate and the floating gate.

18. The non-volatile memory device of claim 17, further comprising:
   a second insulation layer covering a side of the floating gate that is facing in an opposite direction from a side of the floating gate disposed on the tunneling oxide layer.

19. The non-volatile memory device of claim 18, wherein the floating gate is formed between the tunneling oxide layer and the second insulation layer.

20. The non-volatile memory device of claim 13, further comprising:
   a second insulation layer covering a side of the floating gate that is facing in an opposite direction from a side of the floating gate formed over the substrate.

21. The non-volatile memory device of claim 13, wherein the control gates have a height that is substantially equal to a height of the gate structure insulation layer.

22. The non-volatile memory device of claim 13, wherein an upper surface of the control gates is substantially horizontally coplanar to an upper surface of the gate structure insulation layer.

23. The non-volatile memory device of claim 13, wherein the gate structure insulation layer is formed of a material selected from a group consisting of oxide, nitride, and a combination thereof.

24. The non-volatile memory device of claim 13, wherein the salicide layer covers outer surfaces of each of the control gates.

* * * * *